United States Patent [19]
Jones et al.

[11] Patent Number: 6,157,877
[45] Date of Patent: Dec. 5, 2000

[54] APPARATUS AND METHOD FOR TESTING AUTOMOTIVE ELECTRONIC CONTROL UNITS AND BATTERIES AND RELATED EQUIPMENT

[75] Inventors: Barbara L. Jones, Middleton King's Lynn; Paul Smith, Thetford, both of United Kingdom

[73] Assignee: Sun Electric U.K. Limited, King's Lynn, United Kingdom

[21] Appl. No.: 08/708,652

[22] Filed: Sep. 5, 1996

[30] Foreign Application Priority Data

Sep. 5, 1995 [GB] United Kingdom ................. 9518075

[51] Int. Cl.$^7$ ................................................. G01M 15/00
[52] U.S. Cl. ........................... 701/29; 701/101; 73/118.1
[58] Field of Search ............................. 701/99, 101, 110, 701/111, 29; 73/116, 117.2, 117.3, 118.1

[56] References Cited

U.S. PATENT DOCUMENTS

| | | | |
|---|---|---|---|
| 4,060,848 | 11/1977 | Hyatt | 364/200 |
| 4,126,037 | 11/1978 | Hanson et al. | 73/116 |
| 4,433,294 | 2/1984 | Windebank | 324/426 |
| 4,630,470 | 12/1986 | Brooke et al. | 73/146.2 |
| 4,644,245 | 2/1987 | Brown | 320/13 |
| 5,056,023 | 10/1991 | Abe | 701/99 |
| 5,092,343 | 3/1992 | Spitzer et al. | 128/733 |
| 5,191,291 | 3/1993 | Taylor | 324/429 |
| 5,214,582 | 5/1993 | Gray | 701/114 |
| 5,225,762 | 7/1993 | Langford | 320/20 |
| 5,278,509 | 1/1994 | Haynes et al. | 324/427 |
| 5,280,792 | 1/1994 | Leong et al. | 128/702 |
| 5,305,235 | 4/1994 | Izui et al. | 364/551.01 |
| 5,307,290 | 4/1994 | Raviglione et al. | 364/551.01 |
| 5,345,384 | 9/1994 | Przybyla et al. | 364/551.01 |
| 5,371,487 | 12/1994 | Hoffman et al. | 340/425.5 |
| 5,387,871 | 2/1995 | Tsai | 324/429 |
| 5,432,452 | 7/1995 | Fiorina et al. | 324/427 |
| 5,434,495 | 7/1995 | Toko | 320/44 |
| 5,459,660 | 10/1995 | Berra | 73/117.3 |
| 5,657,233 | 8/1997 | Cherrington et al. | 73/117.2 |
| 5,705,743 | 1/1998 | Leonard et al. | 73/116 |
| 5,719,330 | 2/1998 | Carr et al. | 73/118.1 |

FOREIGN PATENT DOCUMENTS

| | | |
|---|---|---|
| 398481 | 11/1990 | European Pat. Off. . |
| 544121 | 6/1993 | European Pat. Off. . |
| 583906 | 2/1994 | European Pat. Off. . |

OTHER PUBLICATIONS

Neural Networks in C++, Adam Blum, John Wiley & Sons, Inc. pp. 37–40 (1992).

*Primary Examiner*—George Dombroske
*Attorney, Agent, or Firm*—Emrich & Dithmar

[57] ABSTRACT

A method and apparatus for testing automotive electronic control units and batteries and other equipment for identification and performance purposes utilizes neural networks to effect waveform analysis on a digitized signal. Identification of electronic control units is by means of correlation of resultant waveform data with corresponding data on known units. Battery testing is by waveform analysis of the battery current during transient connection of a load by a transistorized switching circuit. In both cases the method of testing includes a network learning stage and an ensuing recognition test routine for characteristic waveforms.

18 Claims, 9 Drawing Sheets

Signal in

Switch out

LINEAR ACTIVATION FUNCTION

SIGMOID ACTIVATION FUNCTION

APPARATUS AND METHOD FOR TESTING AUTOMOTIVE ELECTRONIC CONTROL UNITS AND BATTERIES AND RELATED EQUIPMENT

BACKGROUND OF THE INVENTION

1. Field of the Invention

This invention relates to a method and apparatus applicable to the testing of automotive electronic control units and batteries and which finds application also to related and other equipment. Particular applications of the invention relate to the identification of automotive electronic control units and the testing of automotive battery (lead acid and other internal combustion engine starter batteries) performance, but the invention also finds direct applications in relation to non-automotive batteries and equipment and other uses.

2. Description of the Prior Art

In the case of an automotive electronic control unit ("ECU") of the kind used for engine management and anti-skid braking systems, a practical problem which arises in the field of motor vehicle servicing concerns identification of the ECU provided in a particular motor vehicle. For commercial reasons, the vehicle manufacturers often do not supply data relating to the actual ECU's used in a given motor vehicle and this leads to a considerable need for identification data on the part of automotive service organizations.

Attempts to identify an ECU on the basis of its physical form or markings or, indeed, the voltages applied to it in use, have not hitherto provided an answer to this problem and there is a considerable need for some relatively straightforward method whereby an ECU can be tested and identified reasonably rapidly during the routine servicing of a motor vehicle.

Likewise, in the field of automotive and other battery testing, there is a need for improvements in terms of simplification and greater rapidity and reliability of testing.

In the case of automotive batteries, the conventional approach to battery testing is to apply a substantial electrical load to the battery under test for a period of many seconds and to determine the battery condition by estimating the percentage of charge remaining after such test.

The shortcomings of this conventional testing routine include the fact that substantial battery currents flow, generating corresponding substantial amounts of heat and leading to a requirement for heavy components and heat sinks, together with the fact that substantial battery capacity is utilized merely for the purpose of determining its condition.

Accordingly, there is some considerable need for improvements in automobile and other battery testing, including an ability to test rapidly and without draining substantial quantities of electrical power.

To the best of the applicants' knowledge, the use of waveform analysis as a means for classifying and identifying automotive electronic functions has not hitherto been employed at least in relation to ECU recognition and battery testing.

U.S. Pat. Nos. 5,280,792 and 5,092,343 disclose systems for performing methods of classifying intracardiac electrograms using neural networks. The use of these methods relates to the diagnosis of disease conditions. Waveform analysis is not new in many technical fields, but has been applied largely, as in these cases, to diagnostic steps rather than specifically identification steps. Thus, U.S. Pat. No. 5,305,235 discloses a monitoring system for diagnosing the operation of an electrical appliance, and utilizing a neural network which analyzes waveforms and classifies the signals as normal or abnormal and distinguishes particular failure modes.

In relation to ECU analysis, U.S. Pat. No. 5,307,290 discloses a system for testing automotive ECUs in which the ECU under test is coupled to a decoding and analysis sub-system with an associated computer. No waveform analysis utilizing a neural network is involved. U.S. Pat. No. 5,345,384 discloses a method for integrating or retrieving data from an ECU by merely addressing a known location in the memory of the ECU to read therefrom identification data. Such an approach is not available in the absence of sufficient information relating to the ECU.

Prior proposals in relation to battery testing include 4,644,245, which discloses the use of an FET switch permitting heavy battery discharge for approximately one microsecond. The system determines battery condition from voltage measurements during discharge. U.S. Pat. No. 5,191,291 likewise discloses a system employing short duration battery loads as a basis for capacity determination. U.S. Pat. No. 5,432,452 and 5,278,509 disclose systems for monitoring the state-of-charge of rechargeable batteries involving analysis of the voltage/time waveform and utilizing a second derivative of the waveform to indicate when failure has occurred.

No disclosure has been found of a method in which an automotive or other battery is analyzed on the basis of electrical waveform assessment during transient discharge utilizing a neural network to determine waveform characteristics.

SUMMARY OF THE INVENTION

An object of the present invention is to provide a method and apparatus offering improvements in relation to the requirements identified above, or generally.

According to the invention there is provided a method, and corresponding apparatus, of testing a device to determine identifying and/or performance characteristics thereof by subjecting a signal from the device to waveform analysis by means of a neural network.

In the described embodiments, a signal derived from a device to be tested, such as an ECU, battery or other item of equipment, is presented to a neural network for waveform analysis and, by reference to established waveform patterns, the characteristics of the device under test can be determined.

By the use of an analytical approach to the determination of waveform characteristics, using neural networks, there is provided a method and apparatus which is software-intensive rather than hardware—intensive, whereby, as the degree of sophistication available for analytical purposes from software functions increases, with little or no attendant increase in cost, the invention enables the achievement of analytical and identification functions which have hitherto only been achievable for means of relatively large and expensive items of hardware.

In the described embodiment, the raw signal obtained from the vehicle electronic system is pre-processed before submission to the neural network. Thus, the signal is converted from analogue to digital form, and subjected to a fast Fourier transform step to extract the frequency content of the signal. The resultant pre-processed signal is then used as the basis for the recognition process.

Likewise in the embodiment, a sub-set of electrical signals from the connector of the ECU is used for identification purposes by means of the waveform-analysis step carried out by the neural network. The resultant waveform identification enables the pin configuration on the ECU connector to be related to a database of ECU types and pin data.

The embodiment includes a system for signal amplitude control employing an attenuator which prevents damage to the analogue-to-digital converter (ADC) by high-amplitude signals. Analysis of the digital signal after attenuation enables the amplitude of the original signal to be determined, and an input multiplexer to be used to switch the input signal from the ECU between the attenuator and direct to the ADC.

In the embodiment relating to battery testing, the neural network classifies the shape of the transient waveform produced by applying a heavy load across the battery terminals using a semiconductor switch for only a few hundred milliseconds. This reduces the overall power extracted from the battery as compared with conventional techniques, and heavy components and heatsinks are not required.

In the embodiment, a data acquisition system applies a control signal to a power field effect transistor ("FET") acting as a switch for a short period of, e.g., 200 milliseconds. The resultant transient signal is filtered, digitized, and pre-processed before being passed to the neural network for analysis. The period for effecting connection of the load to the battery may be up to 750 milliseconds, and preferably 50 to 500 milliseconds, the preferred time range being 150 to 300 milliseconds.

The output from the neural network is an identification of the battery condition in terms of an estimate of the percentage of charge remaining in the battery, as determined from the shape of the transient on the battery voltage. The neural network is initially trained on batteries from a number of manufacturers and with a range of charges remaining as determined by conventional battery testing means.

The method of battery testing, as applied to automotive starter batteries for internal combustion engines, is also applicable to other batteries, for example those used for low output applications, such as back-up batteries for data handling systems such as RAMs, these including nickel-cadmium (Nicad) and nickel metal hydride (NiMH) and alkaline and Ceramic cells or batteries. According to the electrical capacity and other characteristics of the battery under test, appropriate adjustment of the test parameters is made.

BRIEF DESCRIPTION OF THE DRAWINGS

Embodiments of the invention will now be described by way of example with reference to the accompanying drawings, in which:

FIGS. 4A and 4B show further waveform diagrams relating to the equipment of FIG. 4;

DESCRIPTION OF THE PREFERRED EMBODIMENTS

Figure 1:
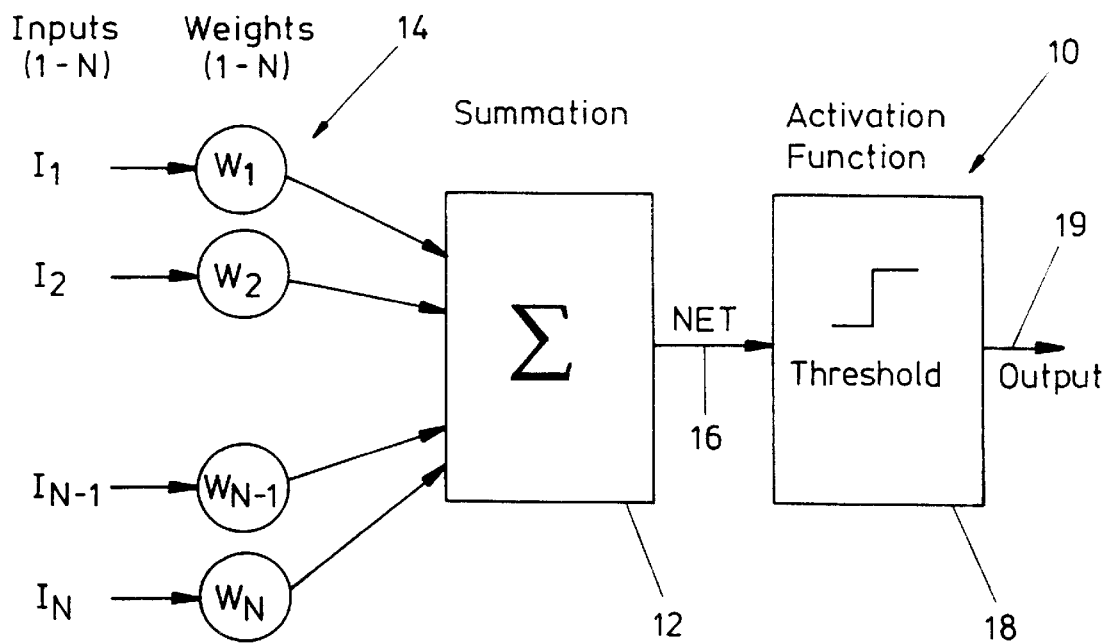
FIG. 1 shows a flow diagram relating to the operation of neural networks.
Figure 1A:
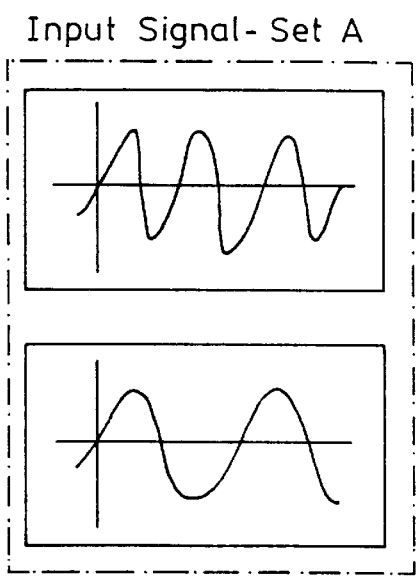
FIGS. 1A and 1B are waveform diagrams for two groups of input signals for the neural network of FIG. 1.
Figure 1B:
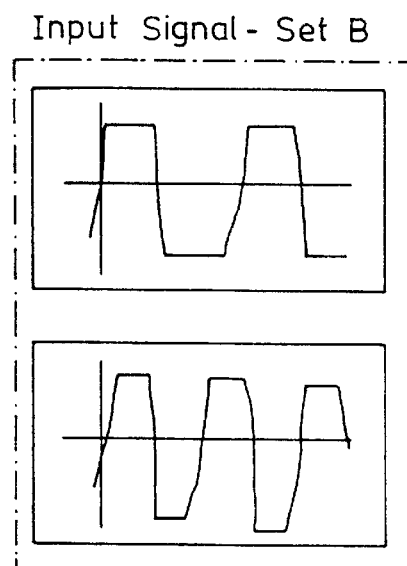

FIGS. 1, 1A and 1B provide a basis for a preliminary review of the function of an artificial neural network ("ANN") as used for recognizing and thus distinguishing the (approximately) sine and square waves shown at FIGS. 1A and 1B by way of a simple example.

As illustrated in FIG. 1, an ANN is conceptually a large number of simple processing elements (embodied by semiconductor units) called neurons which are connected in layers, so that each neuron in one layer connects to each neuron in the successive layer but not to any other neuron in the same layer. This structure provides a pattern recognition capability in the semiconductor electronic system.

As shown in FIG. 1, multiple parallel inputs $I_1$ $I_2$ ... $I_{n-1}$, and $I_n$ of a neuron network 10 are connected to a summing junction 12 via, in each case, a respective weighting function 14. The weighting functions give each input its own weight or priority. The weighting function for the inputs is modified during the training phase of the neuron or neural network, so that the contribution made by a particular input at the summing junction can be increased or reduced with respect to the other inputs to the neurons. The weighting functions are modified during training so that the neurons can distinguish between, for example, the two sets of input signals shown in FIGS. 1A and 1B, namely, (approximately) sine waves and square wave inputs.

The output 16 of summing junction 12 is passed to an activation function 18, which modifies the output from the summing junction in a manner dependent on the activation function chosen for the particular application.

Figure 5:
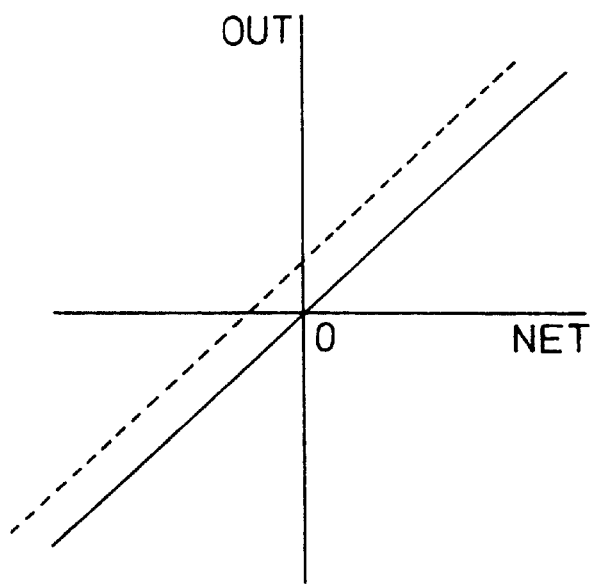
FIGS. 5 and 6 show activation functions, namely linear and sigmoid functions, respectively.
Figure 6:
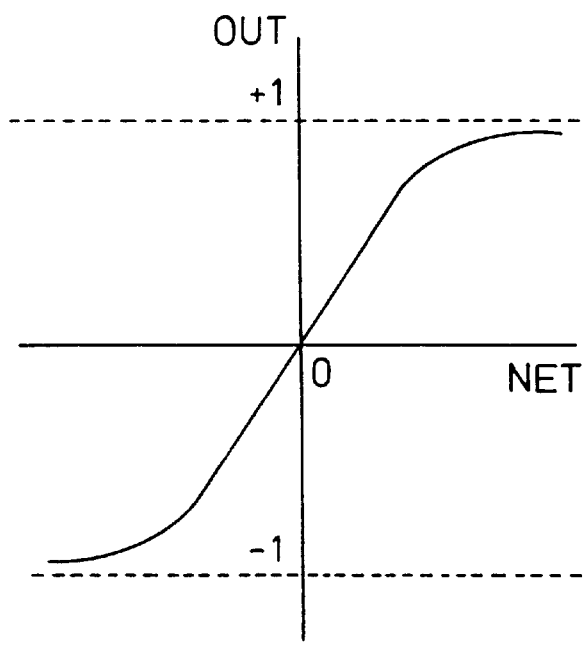

Thus, for example, the output of activation function 18 may change to a 1 if the output of the summing junction crosses a threshold value. Alternatively, the output of the activation function may take any value dependent on the value of the summing junction. This may be referred to as a linear output. An S-shaped output from the activation function may be provided where the output is linear for values from the summing junction which are close to zero, but larger values converge asymptotically to +1 for positive values and −1 for negative values. Such an activation function may be referred to as "sigmoid". FIG. 6 shows a typical sigmoid activation function converging to the +1 and −1 values corresponding to recognition of wave forms previously learned. FIG. 5 shows a corresponding linear activation function enabling a wider range of values corresponding to recognition.

An ANN comprising three layers of neurons, namely an input layer, a hidden layer and an output layer, may be used in recognition tasks of the kind with which the present invention is concerned. Such an ANN is known as a Multi-Layer Perceptron (MLP) in which weights are associated with the MLP's hidden and output layers, the hidden layer having a sigmoid activation function, and the output layer a linear activation function.

In FIG. 1, the output of activation function 18 is indicated for the input signals of FIGS. 1A (approximately, a sine wave) and 1B (approximately, a square wave), namely set A and set B. The output values of 0 or 1 thus correspond, respectively, to recognition of the waveforms of signal sets A and B. The output 16 of summing junction 12 (identified as "NET") may be represented as:

NET=x1w1+x2w2+ . . . +xnwn=XW.

The output 19 of activation function 18 may be expressed as OUTPUT=K (NET), where K=Activation function.

Figure 2:
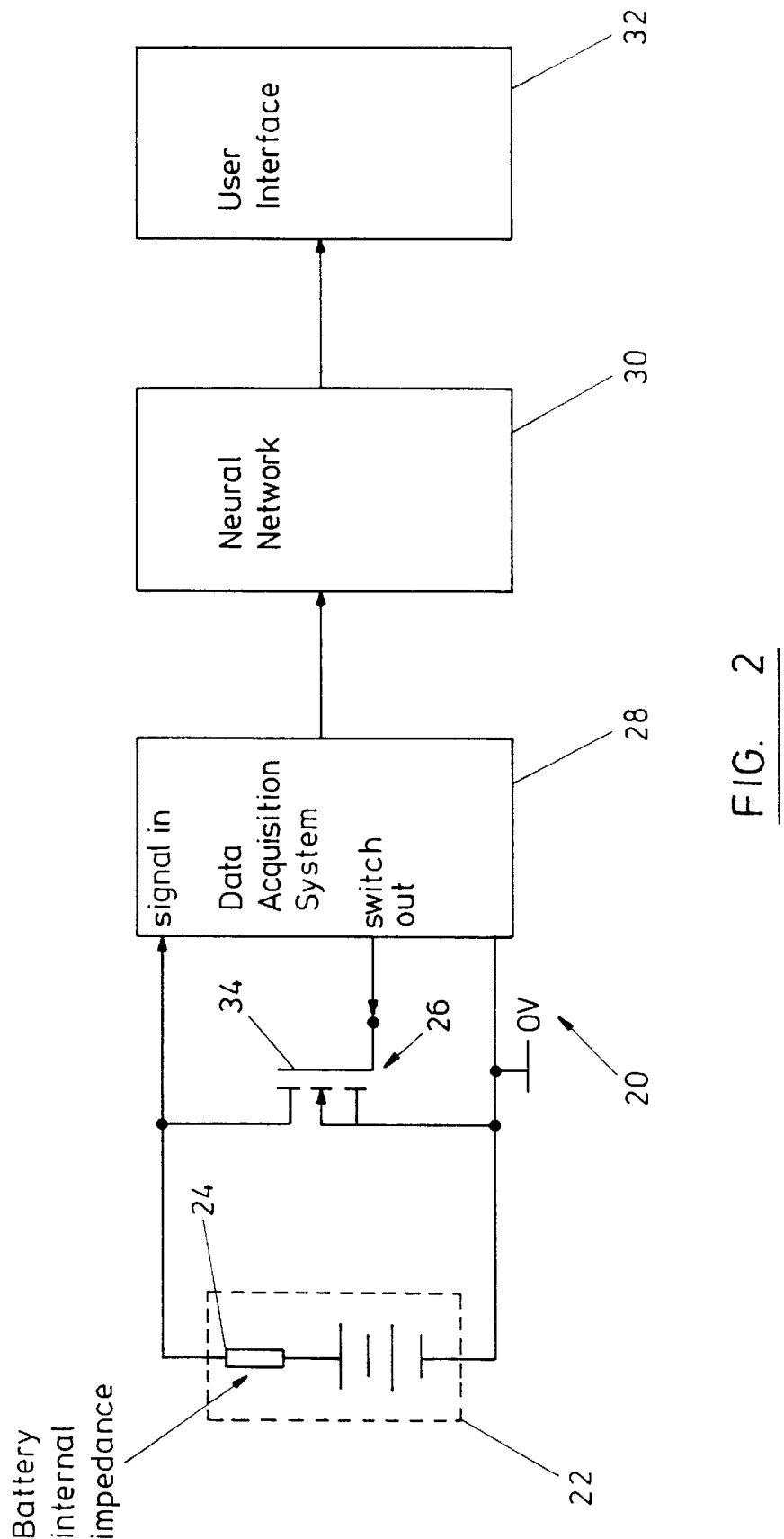
FIG. 2 is a partially schematic and partially functional block diagram of a battery testing circuit incorporating a neural network for waveform analysis.

Turning now to FIG. 2 there is shown a battery testing system 20 in which a lead-acid battery 22 having an internal impedance 24 is connected, via a semiconductor switch 26, to a data acquisition system 28, a neural network 30 and a user interface 32. These latter three components may be part of a software system provided by a suitably programmed personal computer.

In use, system 20 operates as follows. Switch 26 connects a low resistance load 34 across the terminals of battery 22 for a few hundred milliseconds. Switch 26 is an FET acting as an electronically controlled switch having a minimum resistance dependent on the FET type, and typically a few ohms. This resistance may be sufficient to limit the battery current to non-damaging values but, if not, then a resistor is added in series with the FET in line 35.

Figure 2A:
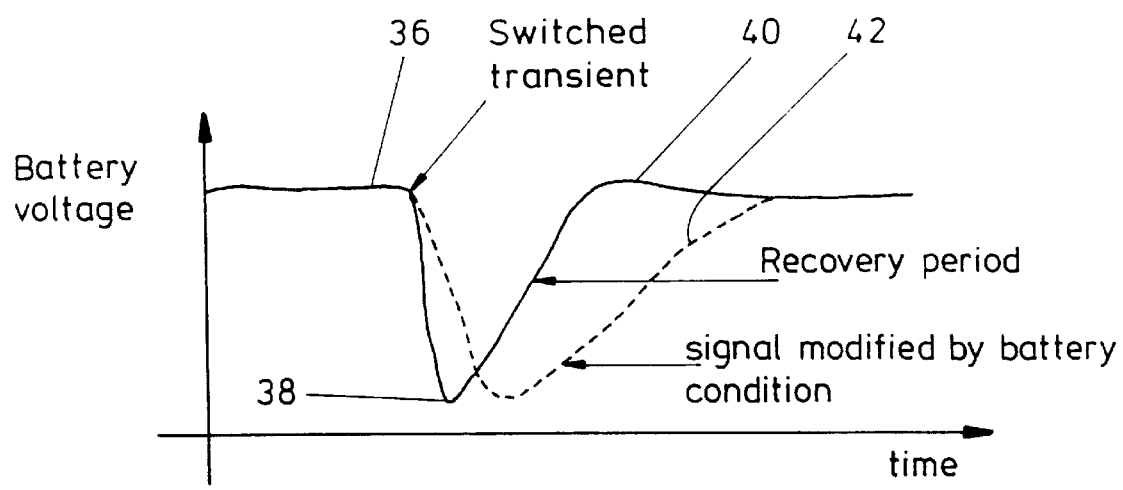
FIGS. 2A, 2B and 2C are waveform diagrams relating to the operation of the circuit of FIG. 2.

FIG. 2A shows the effect on battery voltage which drops from the value indicated at 36 to a minimum value at 38, and the voltage recovers to the value at 40 in the time period indicated.

There is also shown in FIG. 2A a second plot 42 of battery voltage against time in which the battery takes a longer period to recover from the transient load, and this modified voltage profile provides a direct reflection of battery condition.

Figure 2B:
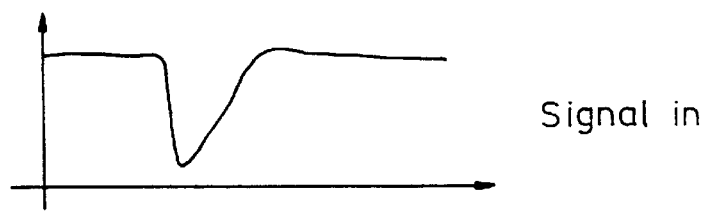
Figure 2C:
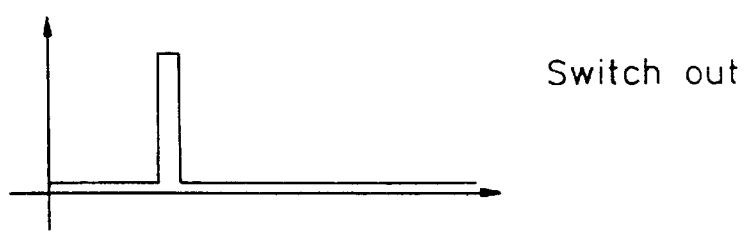

The signal analysis system 28, 30, 32 provides a means for waveform analysis of the battery voltage and correlation of same with data relating to battery performance, so that an assessment of same can be provided on the user interface 32. Thus, the system 28, 30, 32 is presented with an input signal, as shown in FIG. 2B, on the basis of the application of load 34 to battery 22 during the switch period indicated in the plot of switch voltage against time seen in FIG. 2C. As more fully discussed below, the waveform analysis steps enable a directly-expressed measure of battery condition to be rapidly provided by user interface 32.

Figure 3:
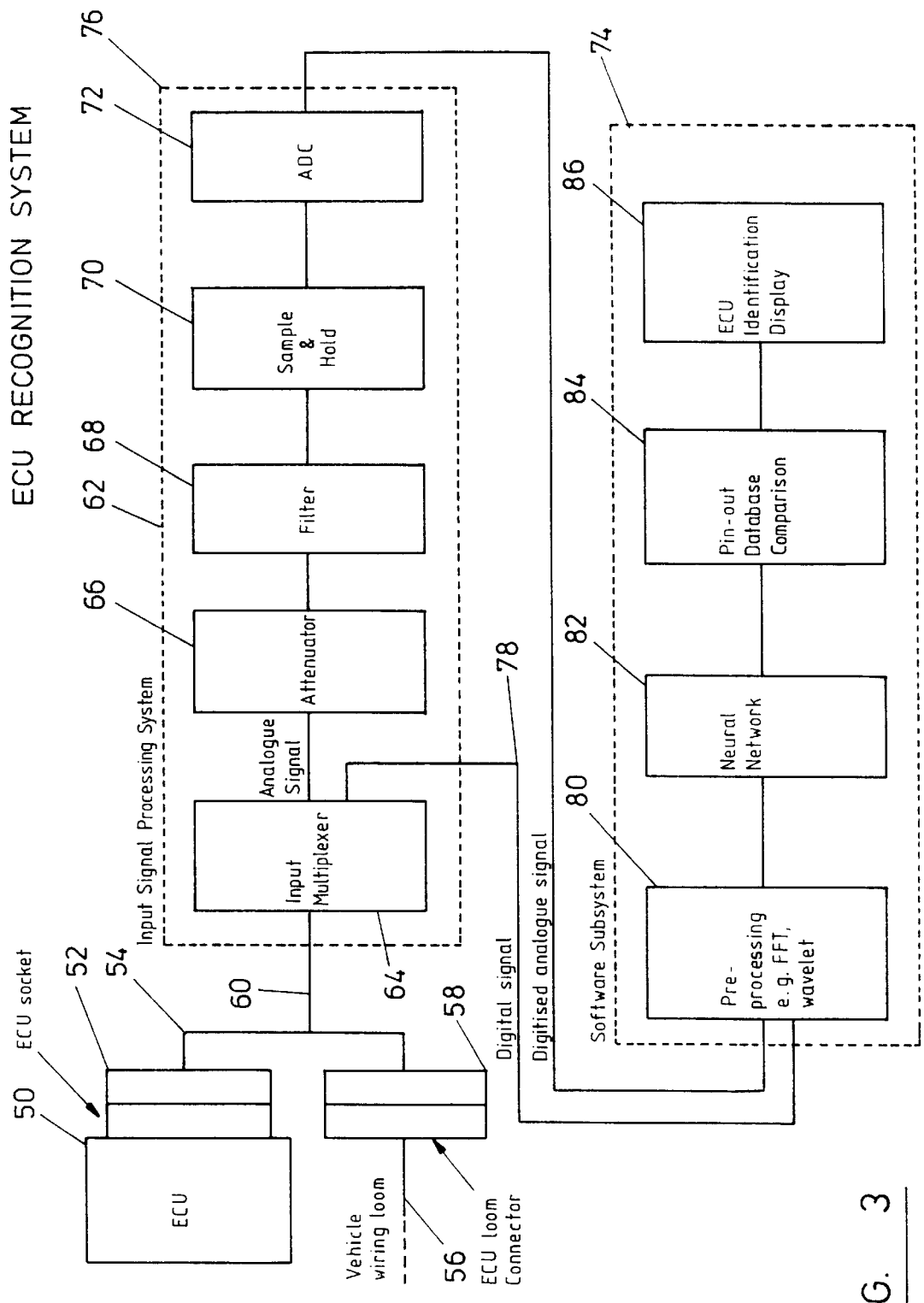
FIG. 3 is a functional block diagram for an ECU recognition system.

Turning now to the embodiment of FIG. 3, there is shown at 50 an ECU having a connection socket 52 coupled at 54 to the vehicle wiring loom 56 through a loom connector 58.

The signal from ECU 50 is connected at 60 to an input signal processing system 62, which comprises an input multiplexer 64, an attenuator 66, a filter 68, a sample-and-hold unit 70 and an analogue-to-digital converter (ADC) 72. The input signal may comprise any of the signal elements shown in FIGS. 8 to 11, deriving from sensors in relation to injectors, crank position, ignition and idle speed control.

Input multiplexer 64 switches the signal from socket 52 of ECU 50 to ADC 72 via attenuator 66, filter 68 and sample & hold function 70, so as to prevent damage to the ADC by high amplitude signals. The digital signal from ADC 72 is processed by a software sub-system 74 to determine the maximum signal amplitude of the analogue signal presented at 60 to the input signal processing system 62. Software sub-system 74 makes a decision, based on this analysis, on the routing of the input signal either via attenuator 66 to ADC system 72 or, in the case of digital data, directly via route 78 to software sub-system 74.

Route 78, which connects directly from input multiplexer 64 to the pre-processing stage 80, is provided for digital data which appears on some of the pins of the ECU. Initially, all signals will be routed through attenuator 66 for analysis. The software can determine which pins of the ECU carry digital data from this analysis.

Attenuator 66 will initially be set to maximum and will be backed-off after analysis of the peak voltage of the input signal. This prevents damages to the ADC and enables selection of the appropriate input voltage range for the data acquisition system.

The functional sub-systems provided in the software sub-system 74 comprise a pre-processing stage 80, a neural network 82, a correlation function indicated at 84 providing a comparison with pin waveform data, and a display 86 for the ECU identification data.

Pre-processing stage 80 provides a system support function, comprising Fast Fourier Transform (FFT) analysis or Wavelet transform analysis of the waveform, so that neural network 82 is assisted in its waveform analysis by presentation of pre-processed waveform data. The output of network 82 to waveform correlation function 84 enables a comparison step to be performed with respect to available ECU connection pin waveform data, whereby display 86 can rapidly provide an identification of the ECU.

In an example of this embodiment, neural network 82 comprised a two-layer feedforward ANN (multi-layer perceptron) and was trained on ECU pin signals obtained from automotive sensors in respect of:
Crank position (sensor) (CPS);
Ignition (IGN);
Idle speed control (ISC);
Injectors (INJ).

Utilizing signals of the kind shown in FIGS. 8 to 11 for training purposes, the target vector output from neural network 82, when presented with specific input signals of the kinds shown in FIGS. 8 to 11, and indicating recognition of same, and with the network configured with four outputs, one for each signal type, is as follows:
Target Vector Output:

| CPS (FIG. 9) | IGN (FIG. 10) | INJ (FIG. 8) | ISC (FIG. 11) |
| --- | --- | --- | --- |
| 1.0. . . | 0.0. . . | 0.0. . . | 0.0. . . |
| 0.0. . . | 1.0. . . | 0.0. . . | 0.0. . . |
| 0.0. . . | 0.0. . . | 1.0. . . | 0.0. . . |
| 0.0. . . | 0.0. . . | 0.0. . . | 1.0. . . |

In an example, the trained neural network, when presented with a validation set of signals of the kind shown in FIGS. 8 to 11, that is to say signals other than those which were used as the training basis for the neural network, but being generally of the same kind, the following results were obtained:

| CPS | IGN | INJ | ISC |
| --- | --- | --- | --- |
| 0.9941 | 0.0540 | 0.0093 | 0.0033 |
| 0.0008 | 0.9984 | −0.0004 | −0.0070 |
| 0.0029 | 0.0006 | 0.9962 | 0.0013 |
| −0.0013 | 0.0022 | 0.0076 | 1.0004 |

The above values are sufficiently close to the target vector output values of 1.0 and 0.0 to enable positive recognition to be effected, and a software algorithm can make a recognition decision based on stored data relating to known ECU systems.

Figure 4:
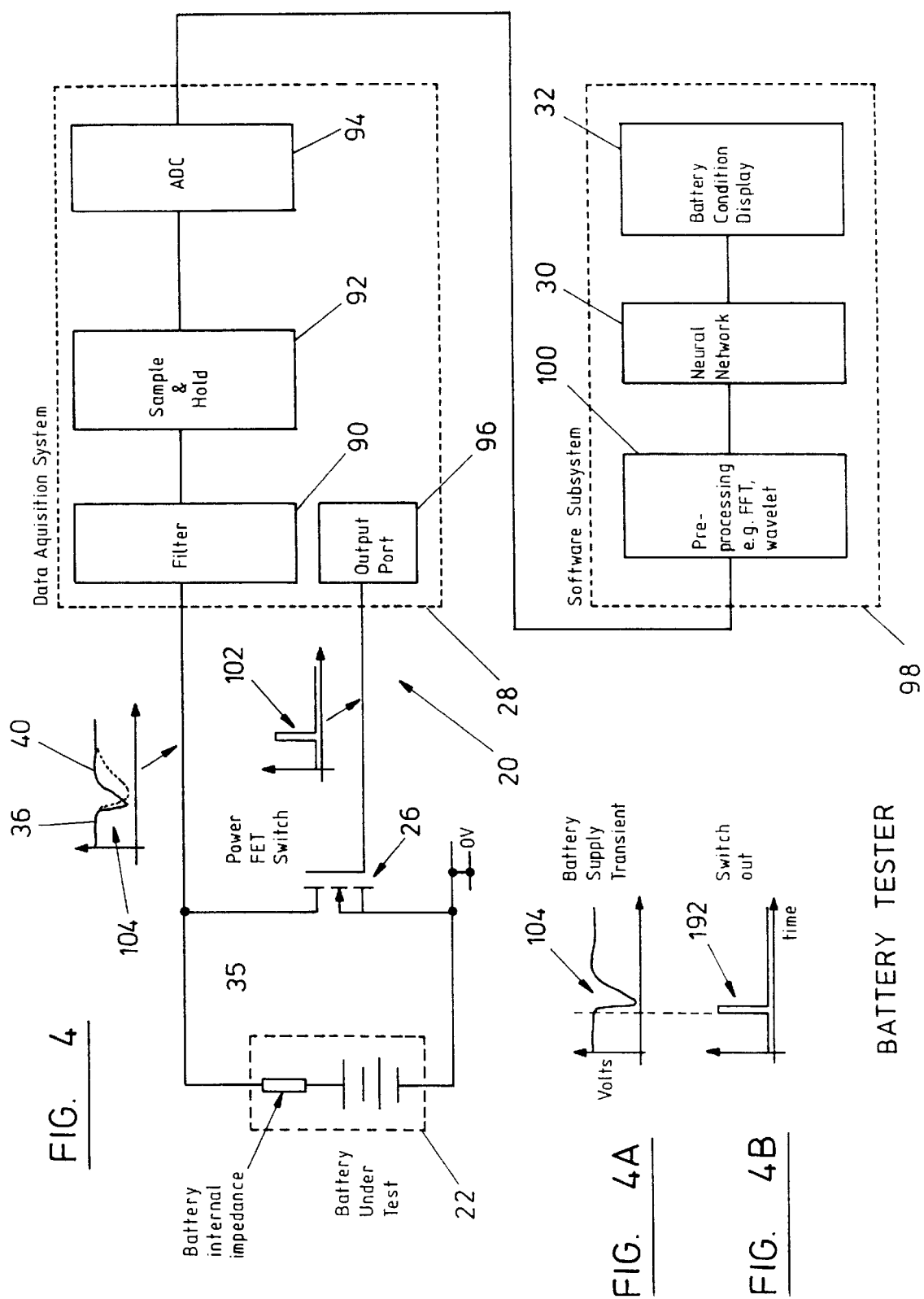
FIG. 4 shows a partially schematic and partially functional block diagram corresponding to that of FIG. 3, but adapted to provide a battery test function.

The battery tester embodiment of FIGS. 4, 4A and 4B corresponds to that of FIGS. 2, 2A and 2B and provides additional data relating to the system functions identified at 28, 30 and 32 in FIG. 2.

In FIGS. 4, 4A and 4B parts corresponding to those in FIGS. 2, 2A and 2B are given the same reference numerals, for consistency.

Data acquisition system 28 comprises filter and sample and hold and ADC functions 90, 92, and 94 respectively. These functions correspond to those identified at 68, 70 and 72 in the input signal processing system 76 of FIG. 3.

Output port 96 provides a digital output signal under software control which drives the semiconductor switch 26, creating the transient on the battery voltage.

Neural network 30 and the user interface or battery condition display 32 form part of a software sub-system 98, which includes a pre-processing signal preparation stage 100. These system functions correspond to those identified at 80, 82 and 86 in the software sub-system 74 of FIG. 3.

In use, battery 22 is connected to system 20 and switch 26 is caused to apply load 34 to the battery on a transient basis for the period indicated in FIG. 4 by plot 102 (corresponding to the plot in FIG. 2C), thereby producing the voltage waveform indicated by plot 104 (corresponding to FIG. 2B).

Figure 7A:
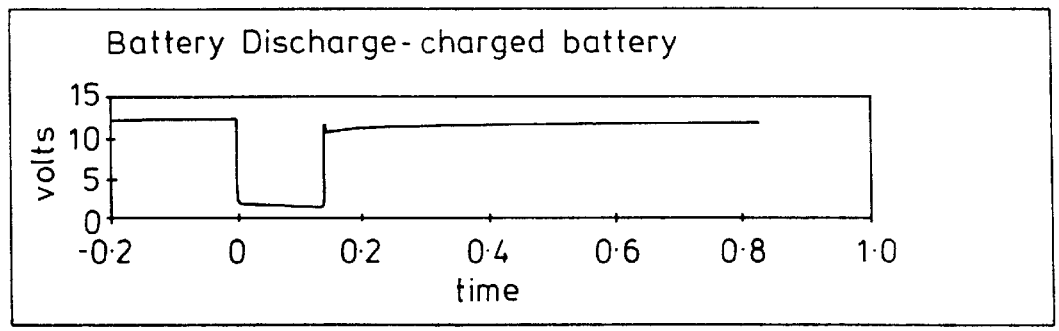
FIGS. 7A and 7B are plots of battery voltage showing transient discharge for, respectively, a charged battery and a partially discharged battery.
Figure 7B:
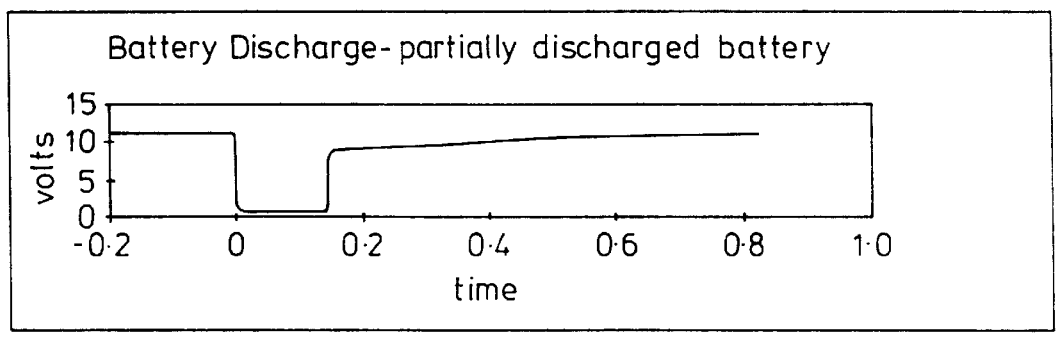
Figure 8:
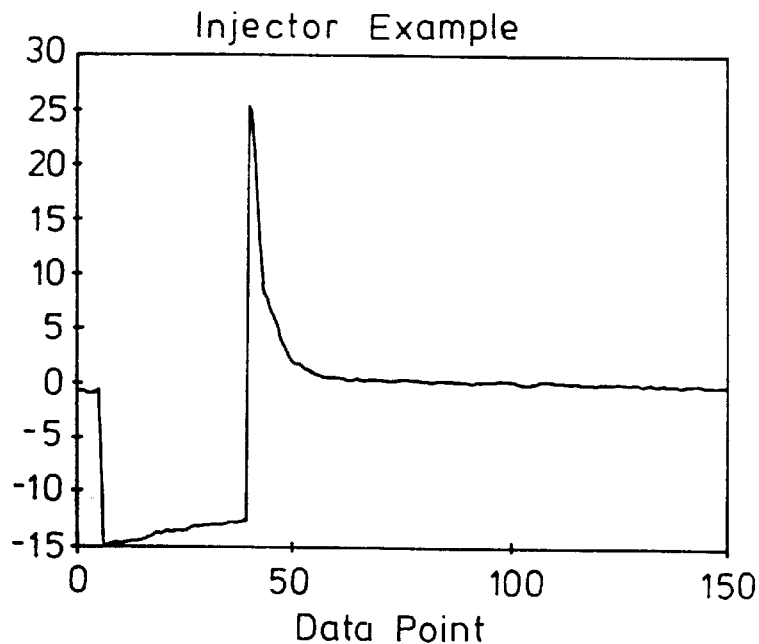
FIGS. 8, 9, 10 and 11 show waveform diagrams relating to input signals from, respectively, crank position sensors, ignition sensors, idle speed control sensors and injector sensors.
Figure 9:
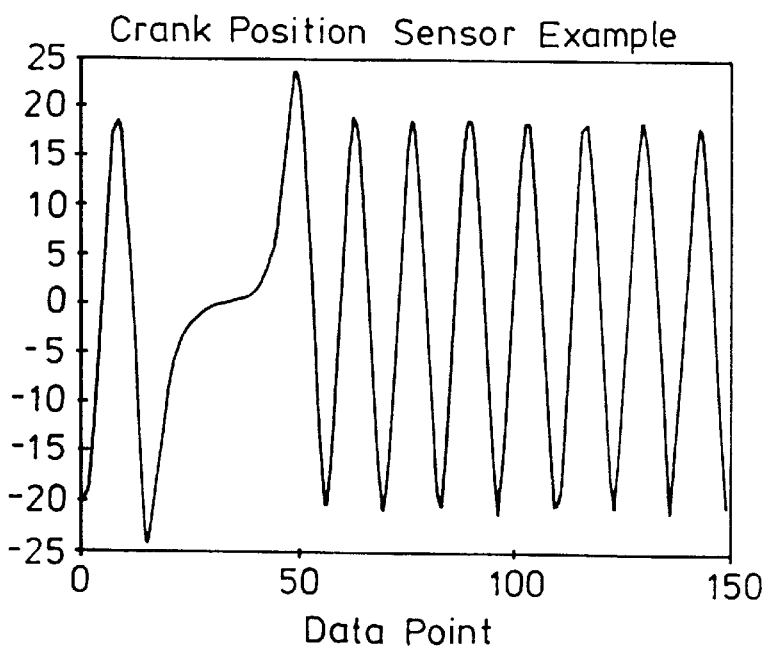
Figure 10:
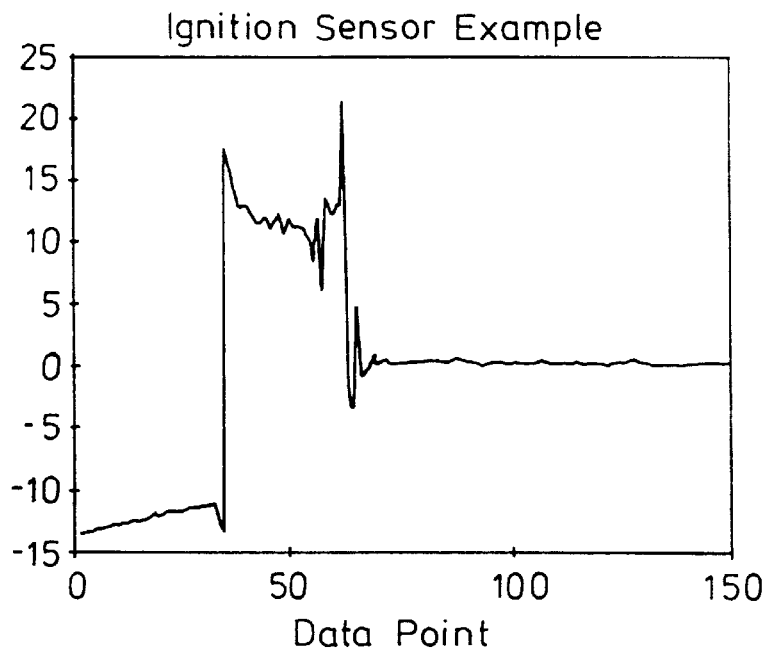
Figure 11:
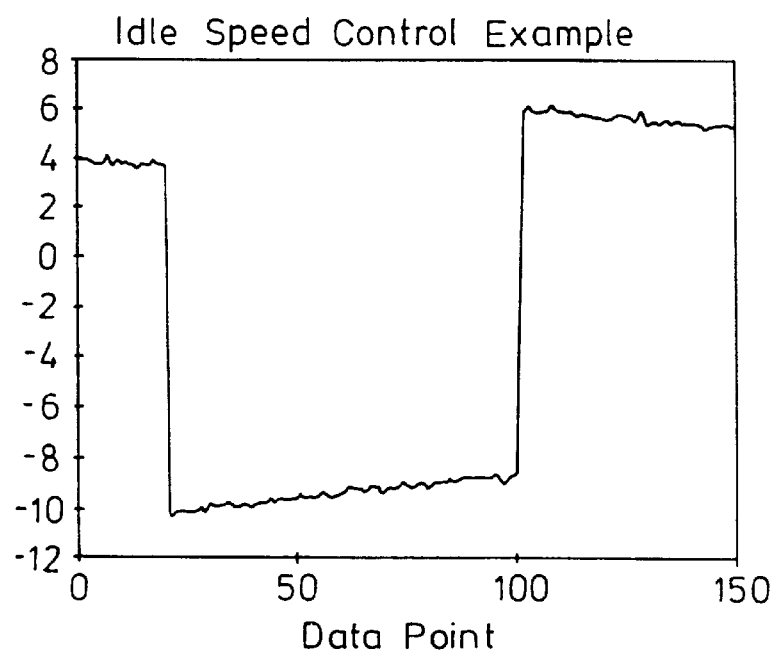

Analysis of the waveform of plot 104 proceeds by data acquisition system 28 and software sub-system 98 in the manner previously described and the battery condition is displayed at 32 in a user-friendly manner in terms of data enabling instant recognition if remedial or other action is required. FIGS. 7A and 7B show a further example of the waveform obtained on transient battery discharge for, respectively, a charged battery and a partially discharged battery. In FIGS. 7A and 7B the plots show the pattern of voltage (on a scale of 0 to 15 volts) against time (on a scale of −0.2 to +1.0 seconds). The same neural network training and recognition steps apply in relation to these closely resembling waveform patterns, whereby recognition of the relatively minor differences in slope and profile enable a battery rapidly to be classified in accordance with its electrical discharge and recovery characteristics.

In the above embodiments, the software sub-system could be implemented on a PC-compatible computer or custom hardware comprising a digital signal processor, for example as available from Texas Instruments of Austin, Tex. under serial number TMS320C50. An algorithm for the neural network is included in the book "Neural Networks In C++" by Adam Blum, published by John Wiley & Sons.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A method of testing an electrical device of an automotive vehicle, to determine characteristics thereof, including identifying and performance characteristics, the method comprising the steps of:

(a) obtaining from the device a signal having a waveform; and (b) using a neural network to perform waveform analysis on the signal from the device.

2. The method of claim 1, and further comprising the step of using the neural network waveform analysis to recognize the waveform of the signal from the device by correlation with waveform data relating to known devices.

3. The method of claim 1, and further comprising the steps of subjecting the signal to conversion to digital form and subsequently to a fast Fourier transform or waveform transform step prior to the waveform analysis by the neural network.

4. The method of claim 1, and further comprising the step of first training the neural network, the training step including providing the neural network with characteristic waveform data relating to the classes of waveforms to be identified in the waveform analysis step of the method.

5. The method of claim 1, wherein the device is an electronic control unit having connectors, the signal from the control unit being a subset of electrical signals on the connectors of the electronic control unit.

6. The method of claim 1, wherein the device is an electronic control unit, and further comprising the steps of: subjecting the signal to an optional attenuation; then converting the signal to digital form, the optional attenuation being selected on the basis of software analysis, by reference to the digital form of the signal, of the amplitude content of the signal prior to conversion, and by reference to the amplitude requirements of the conversion.

7. The method of claim 6, and further comprising the step of subjecting the digital form of the signal to a fast Fourier transform step prior to analysis by the neural network.

8. The method of claim 1, wherein the device is a battery, and further comprising the steps of:

connecting an electrical load across the battery for less than 750 ms to produce a transient current signal having a waveform shape; and monitoring the performance of the battery by analyzing the waveform shape of the transient current signal utilizing the neural network.

9. The method of claim 8, and further comprising the steps of subjecting the current signal from the battery to conversion to a digital form and subsequently to a fast Fourier transform step, prior to analysis by the neural network.

10. Apparatus for testing an electrical device of an automotive vehicle, to determine characteristics thereof, including identifying and performance characteristics, the apparatus comprising:

(a) a connector adapted for connection to the device under conditions of use; and (b) a neural network coupled to said connector and adapted to receive from the device a signal having a waveform and to subject the signal to waveform analysis.

11. The apparatus of claim 10, and further comprising correlation means adapted to cooperate with said neural network to recognize the waveform from the device by correlation with waveform data relating to known devices.

12. The apparatus of claim 10, and further comprising an analog-to-digital converter coupled to the connector for converting the signal to a digital form, and fast Fourier transform or wavelet transform means coupled between the converter and the neural network and adapted to extract the frequency content of the digital form prior to analysis of the digital form by said neural network.

13. The apparatus of claim 10, wherein the device is an electronic control unit, and further comprising an attenuator coupled to said connector for attenuating the signal from the control unit; an analog-to-digital converter coupled to the attenuator for converting the signal from the control unit to a digital form; and amplitude analysis means adapted to analyze the digital form in relation to the amplitude content of the signal prior to conversion, and adapted to cause optional passage of the signal through said attenuator by reference to the amplitude requirements of said analog-to-digital converter.

14. The apparatus of claim 13, and further comprising fast Fourier transform or wavelet transform means coupled between the analog-to-digital converter and the neural network and adapted to extract the frequency content of the digital form prior to analysis of the digital form by said neural network.

15. The apparatus of claim 13, and further comprising means cooperating with said neural network for recognizing the signal waveform from the control unit by correlation with waveform data relating to known control units.

16. The apparatus of claim 10, wherein the device is a battery, and further comprising:

an electrical load for the battery;

a switch to connect the load to the battery for less than 750 ms to produce a current signal having a waveform; and means including the neural network for monitoring the performance of the battery by effecting waveform analysis of the current signal waveform during connection of the load to the battery.

17. The apparatus of claim 16, wherein said means for monitoring includes means for recognizing the current signal waveform from the battery by correlation with waveform data relating to known batteries.

18. The apparatus of claim 16, wherein said means for monitoring includes an analog-to-digital converter for converting the current signal to a digital form, and fast Fourier transform or wavelet transform means coupled between the converter and the neural network and adapted to extract the frequency content of the digital form prior to analysis of the digital form by the neural network.

* * * * *